(12) United States Patent
Chen

(10) Patent No.: US 9,466,366 B1
(45) Date of Patent: Oct. 11, 2016

(54) RESISTIVE MEMORY AND MEMORY CELL THEREOF

(71) Applicant: Winbond Electronics Corp., Taichung (TW)

(72) Inventor: Chien-Lung Chen, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 15/064,616

(22) Filed: Mar. 9, 2016

(30) Foreign Application Priority Data

Dec. 8, 2015 (CN) .......................... 2015 1 0895267

(51) Int. Cl.
*G11C 13/00* (2006.01)

(52) U.S. Cl.
CPC ......... *G11C 13/0069* (2013.01); *G11C 13/004* (2013.01); *G11C 13/0007* (2013.01)

(58) Field of Classification Search
CPC .......... G11C 13/0069; G11C 13/0004; G11C 13/0007

USPC ........................................... 365/148, 100, 46
See application file for complete search history.

(56) References Cited

U.S. PATENT DOCUMENTS 8,144,509 B2 * 3/2012 Jung ........................ G11C 11/16
365/148

* cited by examiner

*Primary Examiner* — Jason Lappas
(74) *Attorney, Agent, or Firm* — Jianq Chyun IP Office

(57) ABSTRACT

A resistive memory apparatus and a memory cell thereof are provided. The resistive memory cell includes a first bit line switch, a first resistor, a first word line switch, a second bit line switch, a second resistor, and a second word line switch. The first and second bit line switches receive a bit line signal, and are controlled by a bit line selecting signal. The first resistor is coupled between the first bit line switch and the first word line switch. The first word line switch is controlled by a word line signal. The second resistor is coupled between the second bit line switch and the second word line switch. The second word line switch is controlled by a bit line selecting signal. When the resistive memory cell is programmed, resistances of the first and second resistors are simultaneously programmed to a high impedance or a low impedance.

10 Claims, 3 Drawing Sheets

RESISTIVE MEMORY AND MEMORY CELL THEREOF

CROSS-REFERENCE TO RELATED APPLICATION

This application claims the priority benefit of China application serial no. 201510895267.6, filed on Dec. 8, 2015. The entirety of the above-mentioned patent application is hereby incorporated by reference herein and made a part of this specification.

BACKGROUND OF THE INVENTION

1. Field of the Invention

The invention relates to a resistive memory cell, and more particularly, to a resistive memory cell with adjustable read margin.

2. Description of Related Art

With advancements in electronic technologies, electronic products have become a necessary tool in daily lives. In response to data storage functions required by the electronic products, many non-volatile memories including the resistive memory have been proposed.

In conventional art, after memory cells of the resistive memory have been through set-reset cycle, there is a certain chance that high and low impedance transformation failure may occur. Statistically, a percentage for such transformation failure to occur is approximately 35%. Such high percentage of the transformation failure can lead to a lowered reliability for storing data by the resistive memory which significantly degrades performance of the resistive memory.

In order to overcome the aforesaid problem, a method of utilizing complementary resistances of two memory cells has been proposed in conventional art for data storing operation. However, the aforesaid problem cannot be solved by such method since the stored data cannot be read if the transformation failure occurs on one of the two memory cells.

SUMMARY OF THE INVENTION

The invention is directed to a resistive memory cell, which is capable of adjusting a read margin thereof while reducing data errors on the memory cells caused by the transformation failure generated from set-reset cycle.

The resistive memory cell of the invention includes a first bit line switch, a first resistor, a first word line switch, a second bit line switch, a second resistor, and a second word line switch. A first terminal of the first bit line switch receives a bit line signal, and the first bit line switch is controlled by a bit line selecting signal to be turned on or off. A first terminal of the first resistor is coupled to a second terminal of the first bit line switch. The first word line switch is connected between a second terminal of the first resistor and a source line in series, and controlled by a word line signal to be turned on or off. A first terminal of the second bit line switch receives the bit line signal, and the second bit line switch is controlled by the bit line selecting signal to be turned on or off. A first terminal of the second resistor is coupled to a second terminal of the second bit line switch. The second word line switch is connected between a second terminal of the second resistor and the source line in series, and controlled by the word line signal to be turned on or off. When the resistive memory cell is programmed, resistances of the first and second resistors are simultaneously programmed to a high impedance or a low impedance.

A resistive memory of the invention includes at least one resistive memory cell and a sensor amplifier. The resistive memory cell includes a first bit line switch, a first resistor, a first word line switch, a second bit line switch, a second resistor, and a second word line switch. A first terminal of the first bit line switch receives a bit line signal, and the first bit line switch is controlled by a bit line selecting signal to be turned on or off. A first terminal of the first resistor is coupled to a second terminal of the first bit line switch. The first word line switch is connected between a second terminal of the first resistor and a source line in series, and controlled by a word line signal to be turned on or off. A first terminal of the second bit line switch receives the bit line signal, and the second bit line switch is controlled by the bit line selecting signal to be turned on or off. A first terminal of the second resistor is coupled to a second terminal of the second bit line switch. The second word line switch is connected between a second terminal of the second resistor and the source line in series, and controlled by the word line signal to be turned on or off. When the resistive memory cell is programmed, resistances of the first and second resistors are simultaneously programmed to a high impedance or a low impedance. The sense amplifier has a first input terminal coupled to the first terminal of the first resistor and a second input terminal which receives a references signal. Herein, an output terminal of the sense amplifier generates read data.

Based on the above, the invention provides two resistor for recording data of one bit. The point is that, when the resistive memory cell is programmed, the resistances of the first and second resistors are simultaneously programmed to the high impedance or the low impedance.

To make the above features and advantages of the present disclosure more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
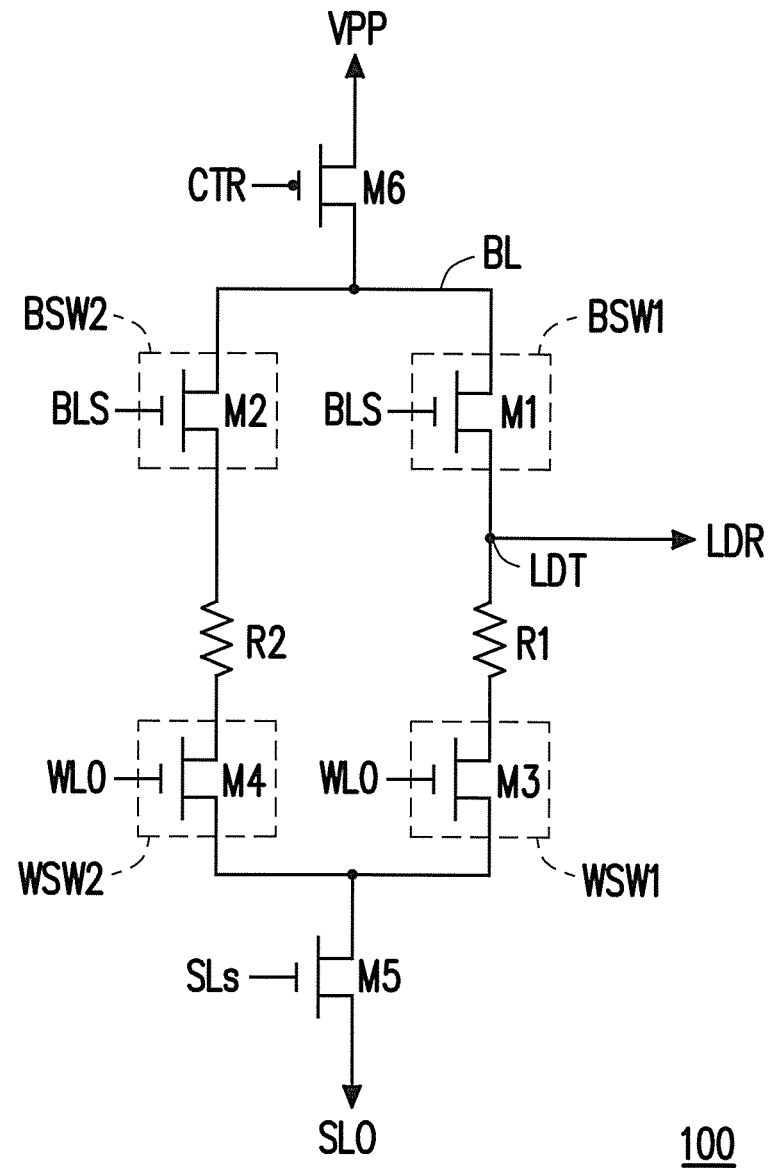
FIG. 1 illustrates a schematic diagram of a resistive memory cell in an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Referring to FIG. 1, FIG. 1 illustrates a schematic diagram of a resistive memory cell in an embodiment of the invention. A resistive memory cell 100 includes bit line switches BSW1 and BSW2, resistors R1 and R2 and word line switches WSW1 and WSW2. The bit line switch BSW1 has a first terminal receiving a bit line signal BL, and is controlled by a bit line selecting signal BLS to be turned on or off. A first terminal of the resistor R1 is coupled to a second terminal of the bit line switch BSW1. The word line switch WSW1 is connected between a second terminal of the resistor R1 and a source line SL0 in series, and controlled by a word line signal WL0 to be turned on or off. The bit line switch BSW2 has a first terminal receiving the bit line signal BL, and is controlled by the bit line selecting signal BLS to be turned on or off. A first terminal of the resistor R2 is coupled to a second terminal of the bit line switch BSW2. The word line switch WSW2 is connected between a second terminal of the resistor R2 and the source line SL0 in series, and controlled by the word line signal WL0 to be turned on or off.

In the present embodiment, a transistor M6 is connected between a power voltage VPP and the bit line switches BSW1 and BSW2 in series. When the transistor M6 is turned on according to a control signal CTR, the power voltage VPP is provided to serve as the bit line signal BL. Further, the resistive memory cell 100 in the present embodiment further includes a transistor M5, and the word line switches WSW1 and WSW2 are coupled to the source line SL0 via the transistor M5. The transistor M5 may be turned on or off according to a gate selecting signal SLs.

During a programming operation performed for the resistive memory cell 100, the bit line switches BSW1 and BSW2, the word line switches WSW1 and WSW2 and the transistors M5 and M6 may be simultaneously turned on. At the time, the first terminals of the resistors R1 and R2 receive the bit line signal BL substantially equal to the power voltage VPP, and the second terminals of the resistors R1 and R2 are commonly coupled to the source line SL0. Meanwhile, the resistors R1 and R2 may change their resistances by performing the programming operation according to a voltage value of the bit line signal BL and a voltage value on the source line SL0.

Herein, it should be noted that, in the present embodiment, the voltage values applied at the two terminals of each of the resistors R1 and R2 are identical. That is to say, variation tendencies of the resistors R1 and R2 are identical. More specifically, the resistors R1 and R2 may be simultaneously programmed to a high impedance, or the resistors R1 and R2 may be simultaneously programmed to a low impedance.

In addition, a node between the bit line switch BSW1 and the resistor R1 may be used to form a data reading terminal LDT. Herein, the data reading terminal is configured to provide an impedance LDR to a sense amplifier (not illustrated), and the sense amplifier is configured to sense data stored by the resistive memory cell 100.

Figure 2:
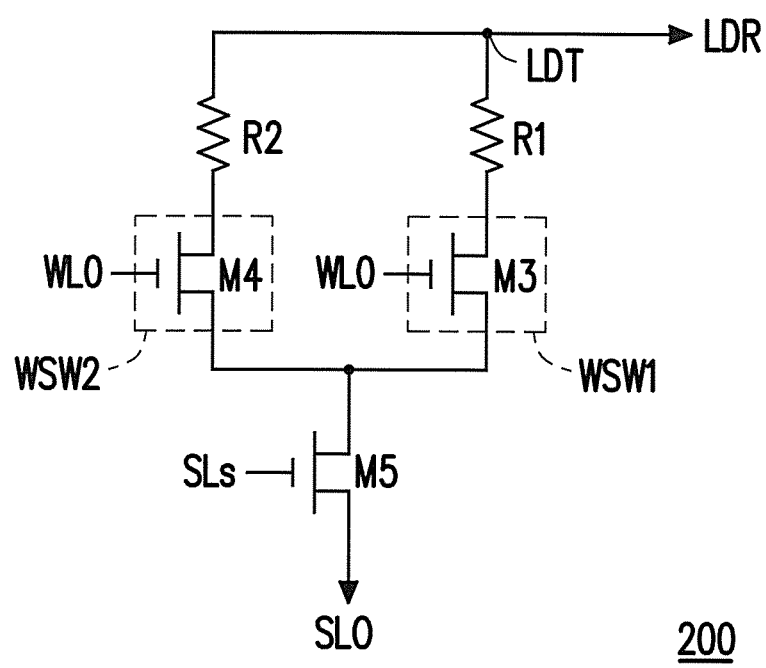
FIG. 2 illustrates a schematic diagram of an equivalent circuit during the reading operation for the resistive memory cell.

On the other hand, during a reading operation performed for the resistive memory cell 100, the transistor M6 may be turned off, whereas the bit line switches BSW1 and BSW2, the word line switches WSW1 and WSW2 and the transistor M5 may be simultaneously turned on. Under this condition, the resistive memory cell 100 may form a schematic diagram of an equivalent circuit during the reading operation for the resistive memory cell as illustrated in FIG. 2. Referring to FIG. 2, the word line switches WSW1 and WSW2 are turned on and the transistor M5 is also turned on. Assuming that the source line SL0 is coupled to a reference ground voltage, accordingly, the impedance LDR provided on the data reading terminal LDT is substantially equal to a parallel resistance of the resistors R1 and R2 (without taking turned on resistances of the word line switches WSW1 and WSW2 and the transistor M5 into account).

By connecting the resistors R1 and R2 in parallel, the impedance LDR provided on the data reading terminal LDT may be adjusted to a smaller impedance. For instance, if the resistances of the resistors R1 and R2 are both programed to a low impedance LR, the impedance LDR provided on the data reading terminal LDR is approximately equal to ½ multiplied by the low impedance LR. Further, the reading operation for the resistive memory cell 100 may be performed through the sense amplifier. Read data may be obtained by setting a threshold impedance through a reference signal provided by the sense amplifier and comparing the impedance LDR with the threshold impedance by the sense amplifier.

In view of the above, it can be known that in the embodiments of invention, the impedance LDR provided on the data reading terminal LDT of the resistive memory cell 100 is lower than the low impedance LR provided by one single resistor. Accordingly, a difference between the impedance LDR and the threshold impedance may be effectively expanded to increase a read margin of the resistive memory cell 100.

The point is that, in case the transformation failure occurs on one of the resistors R0 and R1 of the resistive memory cell 100, a correct read data may still read by performing the reading operation on the resistive memory cell 100. For instance, when the resistor R0 is maintained at a high impedance HR due to occurrence of the transformation failure, the impedance LDR provided on the data reading terminal LDT of the resistive memory cell 100 is equal to HR//LR (a parallel value of the high impedance HR and the low impedance LR) and less than the low impedance LR, so that the correct read data may still be read accordingly.

Referring back to FIG. 1, additionally, in the embodiments of the invention, the bit line switches BSW1 and BSW2 are constituted by transistors M1 and M2 respectively. A first terminal of the transistor M1 receives the bit line signal BL; a second terminal of the transistor M1 is coupled to the first terminal of the resistor R1; and a control terminal of the transistor M1 receives the bit line selecting signal BLS. A first terminal of the transistor M2 receives the bit line signal BL; a second terminal of the transistor M2 is coupled to the first terminal of the resistor R2; and a control terminal of the transistor M2 receives the bit line selecting signal BLS. Herein, the transistors M1 and M2 may both be the N-type transistor, and may be simultaneously turned on or off according to the same bit line selecting signal BLS.

The word line switches WSW1 and WSW2 are constituted by transistors M3 and M4 respectively. A first terminal of the transistor M3 is coupled to the second terminal of the resistor R1; a second terminal of the transistor M3 is coupled to the source line SL0 via the transistor M5; and a control terminal of the transistor M3 receives the word line signal WL0. Further, a first terminal of the transistor M4 is coupled to the second terminal of the resistor R2; a second terminal of the transistor M4 is coupled to the source line SL0 via the transistor M5; and a control terminal of the transistor M4 receives the word line signal WL0. Herein, the transistors M3 and M4 may both be the N-type transistor, and may be simultaneously turned on or off according to the same word line signal WL0.

Figure 3:
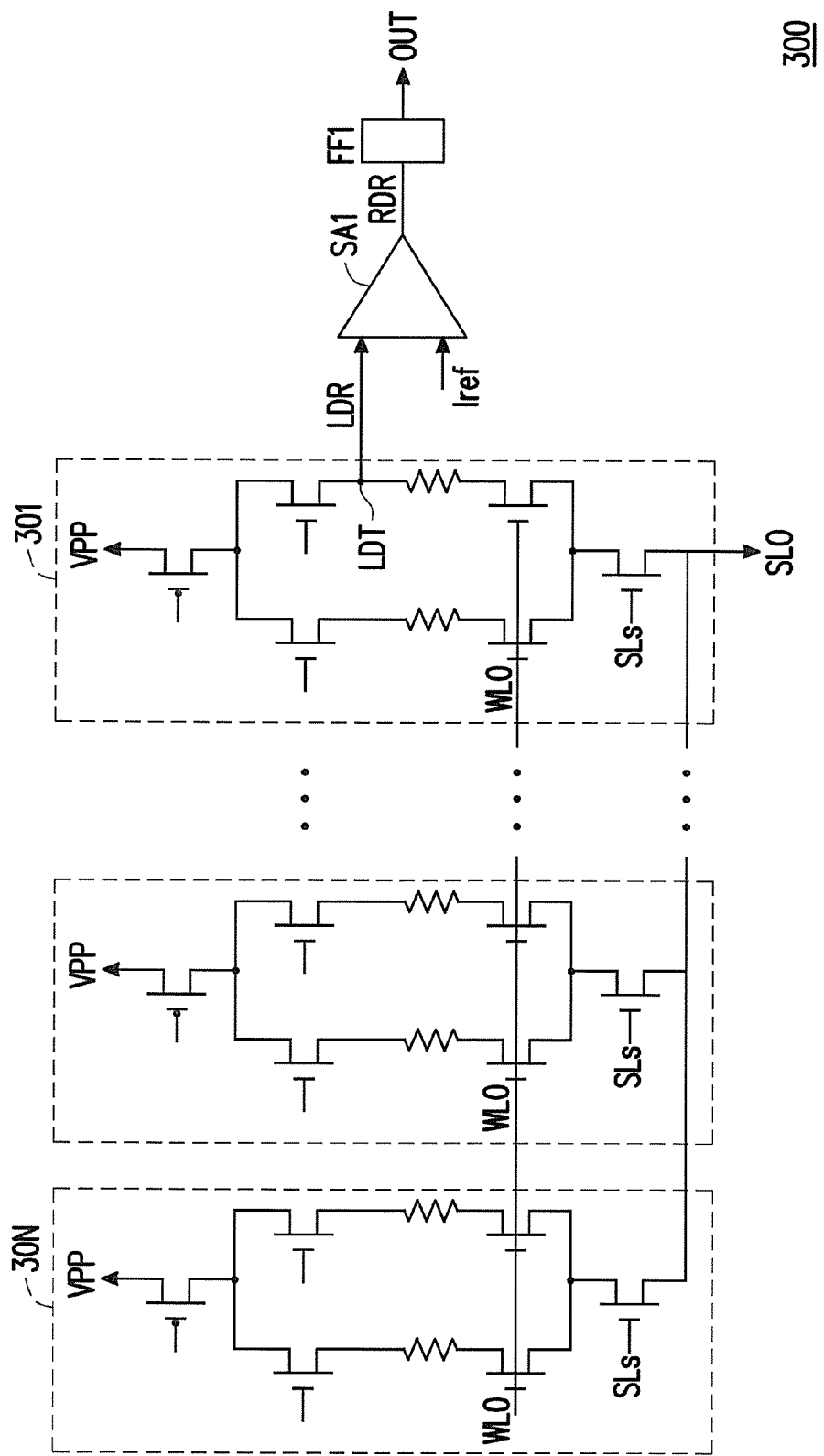
FIG. 3 illustrates a schematic diagram of a resistive memory in an embodiment of the invention.

Referring to FIG. 3, FIG. 3 illustrates a schematic diagram of a resistive memory in an embodiment of the invention. A resistive memory 300 includes one or more resistive memory cells 301 to 30N, a sensor amplifier SA1 and a latch FF1. Structure and operating method of each of the resistive memory cells 301 to 30N are identical to those of the resistive memory cell 100 as described in the foregoing embodiments, which are not repeated hereinafter. The sense amplifier SA1 may be a current-type sense amplifier. In the present embodiment, an input terminal of the sense amplifier SA1 is coupled to the data reading terminal LDT of one of the resistive memory cells 301 to 30N (e.g., the resistive memory cell 301), and another terminal of the sense amplifier SA1 can receive a reference current Iref. The sense amplifier SA1 generates a current according to the impedance LDR provided by the data reading terminal LDT, and compares such current with the reference current Iref to thereby obtain read data RDR. The latch FF1 receives the read data RDR, and generates a final read result OUT by latching the read data RDR after the sense amplifier SA1 can stably output the read data RDR.

Herein, the latch FF1 may be a flip-flop of a digital logic gate and may conduct a data latch operation according to a pulse signal. A time in which pluses are provided by the pulse signal may be configured according a time point when the sense amplifier SA can stably output the read data RDR.

Additionally, in the embodiments of the invention, when it is found that the transformation failure occurs on part of the resistors in the resistive memory 300, condition and amount distributions of the transformation failure may be measured by utilizing a measuring means. More specifically, when it is found that in the resistive memory 300, the transformation failures on all resistors of the same resistive memory cell are occurred when the high impedance HR cannot be transformed to the low impedance LR, it can be determined that the transformation failure occurs on the resistor with the high impedance HR whenever the two resistors of the same resistive memory cell include one being the high impedance HR while another one being the low impedance LR, so that the resistors with the high impedance HR may be adjusted back to the low impedance LR. Accordingly, the resistors in the resistive memory cell may be maintained at a correct state.

To sum up, in the invention, two programmable resistors are disposed in one single resistive memory cell, and data are stored by programming the two resistors to the resistances with the same tendency. As a result, during the reading operation performed for the resistive memory cell, a possibility for a reading failure to occur on the resistive memory cell may be lowered by connecting the two resistors in parallel to thereby increase the read margin of the resistive memory cell. Further, when the transformation failure occurs on one resistor, the resistive memory cell of the invention can still provide the correct read data, so as to maintain the accuracy of the data. Additionally, because the two resistors in one single resistive memory cell are programmed to the same impedance tendency in the invention, the programming operations performed for the two resistors of one single resistive memory cell may be completed simultaneously to reduce the time required for programming.

Although the present disclosure has been described with reference to the above embodiments, it will be apparent to one of ordinary skill in the art that modifications to the described embodiments may be made without departing from the spirit of the disclosure. Accordingly, the scope of the disclosure will be defined by the attached claims and not by the above detailed descriptions.

What is claimed is:

1. A resistive memory cell, comprising:
a first bit line switch, having a first terminal receiving a bit line signal, and controlled by a bit line selecting signal to be turned on or off;
a first resistor, having a first terminal coupled to a second terminal of the first bit line switch;
a first word line switch, connected between a second terminal of the first resistor and a source line in series, and controlled by a word line signal to be turned on or off;
a second bit line switch, having a first terminal receiving the bit line signal, and controlled by the bit line selecting signal to be turned on or off;
a second resistor, having a first terminal coupled to a second terminal of the second bit line switch; and
a second word line switch, connected between a second terminal of the second resistor and the source line in series, and controlled by the word line signal to be turned on or off,
wherein when the resistive memory cell is programmed, resistances of the first and second resistors are simultaneously programmed to a high impedance or simultaneously programmed to a low impedance.

2. The resistive memory cell according to claim 1, wherein a node between the first resistor and the first bit line switch is used as a data reading terminal, and when the resistive memory cell is read, the first and second bit line switches and the first and second word line switches are turned on and the data reading terminal provides a first impedance to a sense amplifier.

3. The resistive memory cell according to claim 2, wherein the first impedance is equal to a parallel resistance of the first resistor and the second resistor.

4. The resistive memory cell according to claim 1, wherein the first bit line switch being a first transistor, a first terminal of the first transistor receiving the bit line signal, a second terminal of the first transistor being coupled to the first terminal of the first resistor, a control terminal of the first transistor receiving the bit line selecting signal, the first word line switch being a second transistor, a first terminal of the second transistor being coupled to the second terminal of the first resistor, a second terminal of the second transistor being coupled to the source line, a control terminal of the second transistor receiving the word line signal.

5. The resistive memory cell according to claim 1, wherein the second bit line switch being a first transistor, a first terminal of the first transistor receiving the bit line signal, a second terminal of the first transistor being coupled to the first terminal of the second resistor, a control terminal of the first transistor receiving the bit line selecting signal, the second word line switch being a second transistor, a first terminal of the second transistor being coupled to the second terminal of the second resistor, a second terminal of the second transistor being coupled to the source line, a control terminal of the second transistor receiving the word line signal.

6. A resistive memory, comprising:
at least one resistive memory cell, comprising:
a first bit line switch, having a first terminal receiving a bit line signal, and controlled by a bit line selecting signal to be turned on or off;
a first resistor, having a first terminal coupled to a second terminal of the first bit line switch;
a first word line switch, connected between a second terminal of the first resistor and a source line in series, and controlled by a word line signal to be turned on or off;
a second bit line switch, having a first terminal receiving the bit line signal, and controlled by the bit line selecting signal to be turned on or off;

a second resistor, having a first terminal coupled to a second terminal of the second bit line switch; and a second word line switch, connected between a second terminal of the second resistor and the source line in series, and controlled by the word line signal to be turned on or off, wherein when the resistive memory cell is programmed, resistances of the first and second resistors are simultaneously programmed to a high impedance or simultaneously programmed to a low impedance; and a sense amplifier, having a first input terminal coupled to the first terminal of the first resistor and a second input terminal receiving a references signal, wherein an output terminal of the sense amplifier generates read data.

7. The resistive memory according to claim 6, wherein the sense amplifier is a current-type sense amplifier which generates a first current and a second current respectively according to signals on the first input terminal and the second input terminal and generates the read data by comparing the first current and the second current.

8. The resistive memory according to claim 6, wherein a node between the first resistor and the first bit line switch is used as a data reading terminal, and when the resistive memory cell is read, the first and second bit line switches and the first and second word line switches are turned on and the data reading terminal provides a first impedance to a sense amplifier.

9. The resistive memory according to claim 8, wherein the first impedance is equal to a parallel resistance of the first resistor and the second resistor.

10. The resistive memory according to claim 6, wherein the reference signal is a reference current.

* * * * *